United States Patent
Graham et al.

(10) Patent No.: US 8,906,730 B2
(45) Date of Patent: Dec. 9, 2014

(54) METHOD OF FORMING MEMBRANES WITH MODIFIED STRESS CHARACTERISTICS

(75) Inventors: Andrew B. Graham, Redwood City, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 32 days.

(21) Appl. No.: 13/232,073

(22) Filed: Sep. 14, 2011

(65) Prior Publication Data

US 2012/0264250 A1 Oct. 18, 2012

Related U.S. Application Data

(60) Provisional application No. 61/475,432, filed on Apr. 14, 2011.

(51) Int. Cl.
*B81C 1/00* (2006.01)
*B81B 3/00* (2006.01)
*G01L 9/00* (2006.01)

(52) U.S. Cl.
CPC ........... *B81B 3/0072* (2013.01); *B81C 1/00666* (2013.01); *G01L 9/0042* (2013.01); *B81B 2201/0264* (2013.01)
USPC .................................... 438/53; 257/E21.214

(58) Field of Classification Search
CPC ................. H01L 2224/73265; H01L 2924/00; H01L 2224/32225; H01L 2224/97
USPC .......................... 438/50, 52, 53; 257/E29.324
See application file for complete search history.

(56) References Cited

U.S. PATENT DOCUMENTS

| | | | |
|---|---|---|---|
| 6,664,126 B1 | 12/2003 | Devoe et al. | |
| 6,913,941 B2 | 7/2005 | O'Brien et al. | |
| 7,056,757 B2 | 6/2006 | Ayazi et al. | |
| 7,825,484 B2 | 11/2010 | Martin et al. | |
| 2005/0178208 A1 | 8/2005 | Benzel et al. | |
| 2007/0201709 A1 | 8/2007 | Suzuki et al. | |
| 2010/0032775 A1 | 2/2010 | Morris, III et al. | |
| 2010/0295138 A1 | 11/2010 | Montanya Silvestre et al. | |

FOREIGN PATENT DOCUMENTS

DE 102006022377 A1 11/2007
GB 2128806 A 5/1984

OTHER PUBLICATIONS

WO 2009/096576 with certified English's translation.*
Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).
Chen et al., "An Integrated Solution for Wafer-Level Packaging and Electrostatic Actuation of Out-Of-Plane Devices," Paper from Stanford University, 2009, pp. 1071-1074, IEEE, USA (4 pages).
Chen, "Electrode Integrated Wafer-Level Packaging for Out-of-Plane MEMS Devices," Abstract Preview, International Microelectronics and Packaging Society, 2009, USA (1 pages).

(Continued)

*Primary Examiner* — Tony Tran
(74) *Attorney, Agent, or Firm* — Maginot Moore & Beck LLP

(57) ABSTRACT

A method of modifying stress characteristics of a membrane in one embodiment includes providing a membrane layer, determining a desired stress modification, and forming at least one trough in the membrane layer based upon the determined desired stress modification.

20 Claims, 5 Drawing Sheets

(56) References Cited

OTHER PUBLICATIONS

Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).

Park et al., "Untraminiature encapsulated accelerometers as a fully implantable sensor for implantable hearing aids," Biomed Microdevices, 2007, Springer, USA (11 pages).

Web site publication, "Encapsulation for RF MEMS," http://micromachine.stanford.edu/~kuanlinc/Professional/Encapsulation%20for20%RF%20 . . . Downloaded Apr. 1, 2011, (4 pages).

International Search Report and Written Opinion in corresponding international application (i.e., PCT/US2012/033553), completed Sep. 7, 2012 (9 pages).

\* cited by examiner

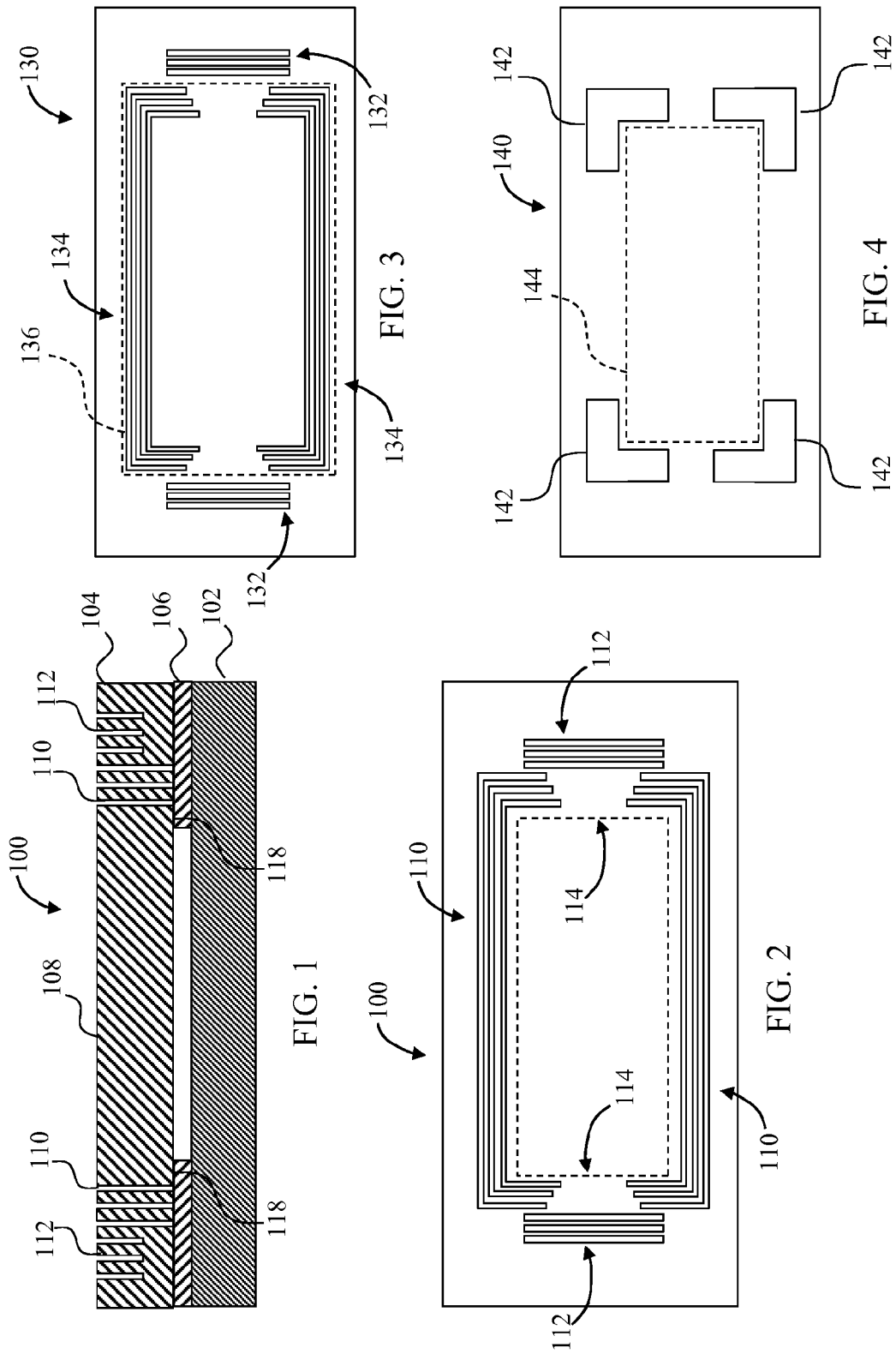

METHOD OF FORMING MEMBRANES WITH MODIFIED STRESS CHARACTERISTICS

This application claims the benefit of U.S. Provisional Application No. 61/475,432, filed on Apr. 14, 2011.

FIELD OF THE INVENTION

This invention relates to membrane-based devices such as micromechanical electrical system (MEMS) pressure sensors devices or semiconductor devices incorporating a membrane.

BACKGROUND

The manufacture of micromechanical electrical system (MEMS) such as pressure sensors and other devices incorporating a membrane poses serious challenges because of the sensitivity of the devices. Typically, the devices which are made of silicon, (polysilicon or silicon-germanium) must exhibit low stress values or predetermined stress values along with low or specific stress gradient properties. Stress reduction is accordingly typically achieved during a stress/stress-gradient relief step during a high temperature annealing process.

MEMS devices however, can be very complicated devices with a number of mechanical parts that are integrated with other permanent and/or temporary (sacrificial) materials. The integrated parts may exhibit detrimental interactions due to the thermal budget. Thus, subsequent annealing steps could affect the layers previously deposited/annealed and therefore modify the film stress and stress gradient values of the devices. Thus, the timing and manner in which stress relief is accomplished must be carefully planned. This adds complexity and costs to the manufacturing process.

Various attempts have been made to control stress in the prior art. Some of those attempts include development of specialized films. While effective at reducing stress, these films suffer various shortcomings such as lack of conductivity, roughness, and irregular electrical properties. Other approaches include the use of doping or specific atmosphere control while depositing films. These approaches affect the chemical composition of the films.

What is needed, therefore, is a simple and effective approach to modification of stress characteristics within a membrane. A further need exists for an approach to modification of stress characteristics within a membrane that does not alter the chemical composition membrane.

SUMMARY

A method of modifying stress characteristics of a membrane in one embodiment includes providing a membrane layer, determining a desired stress modification, and forming at least one trough in the membrane layer based upon the determined desired stress modification.

BRIEF DESCRIPTION OF THE DRAWINGS

FIG. 1 depicts a side cross sectional view of a MEMS device with a released membrane wherein stress characteristics have been modified by planned incorporation of a mixture of partial and full depth stress modifying troughs in accordance with principles of the invention;

FIG. 2 depicts a top plan view of the MEMS device of FIG. 1 showing overlapping troughs used to substantially completely isolate the released membrane from stress generated in the membrane layer outside of the released membrane area;

FIG. 3 depicts a top plan view of a MEMS device including overlapping troughs wherein some of the troughs are located within the released membrane area so as to modify both the stiffness of the released membrane and the stress characteristics of the released membrane;

FIG. 4 depicts a top plan view of a MEMS device with troughs extending about the corners of the released membrane, wherein the troughs of FIG. 4 are significantly wider than the troughs of FIG. 3;

DESCRIPTION

Figure 5:
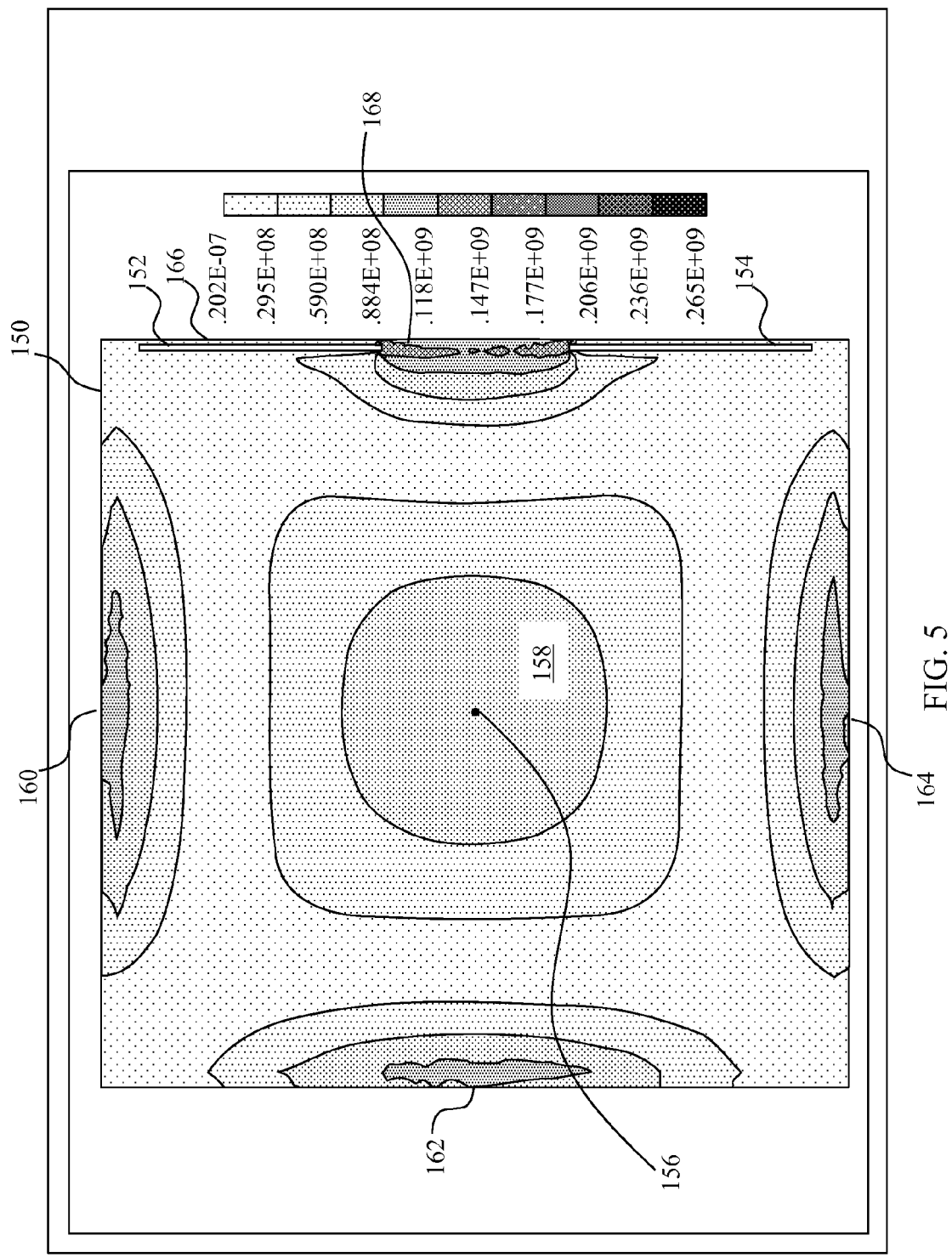
FIG. 5 depicts the modeled results of the application of a pressure to a released membrane incorporating spaced apart troughs along one edge of the membrane resulting in a focusing of stress in the area between the space apart troughs resulting in increased stress levels over a smaller area as compared to edges without troughs.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIGS. 1 and 2 depict a MEMS device 100 which may be, for example, a pressure detector. The MEMS device 100 includes a substrate layer 102 and a membrane layer 104 which is spaced apart from the substrate layer 102 by a spacer layer 106. The membrane layer 104 may be a silicon layer and the spacer layer 106 may be an oxide layer.

The membrane layer 104 has a released membrane portion 108. Stress within the membrane portion 108 is isolated by positioning of full stress troughs 110 and partial stress troughs 112 about the membrane portion 108. In the embodiment of FIGS. 1 and 2, the partial troughs 112 overlap a non-troughed area 114 located between the opposing end portions of the full stress troughs 110. Because the partial stress troughs 112 do not extend completely through the membrane layer 104, the structural integrity of the membrane layer 104 is greater in the area about the partial stress troughs 112 as compared to the structural integrity of the membrane layer 104 in the area about the full stress troughs 110. The stress relief, however, is not as great.

In the embodiment of FIGS. 1 and 2, all of the stress relief troughs 10 and 112 are located outside of the released membrane 108. Thus, the released membrane 108 is fully supported by an overlying portion 118 that is positioned on an upper surface of the spacer layer 106. Accordingly, the stiffness of the released membrane 108 is primarily dictated by the thickness and material of the released membrane 108, although the width and proximity of the full stress troughs 110 will provide some reduction in the stiffness of the released membrane 108.

FIG. 3 depicts an embodiment of a MEMS device 130 that provides increased stiffness reduction. The MEMS device 130 includes a plurality of troughs 132 and 134. The troughs 132, which may be full or partial troughs depending upon the desired strength and stress modification, which are located adjacent to a released membrane 136. The troughs 132 will thus have a significant effect on stress modification, but a lesser effect on the stiffness of the membrane 136. The troughs 134, however, are located within the outer perimeter of the released membrane 136. Accordingly, while the combination of the troughs 136 and 134 provide a significant isolation of the released membrane 136 from stresses originating outside of the released membrane 136, the troughs 134 also significantly reduce the stiffness of the membrane 136.

Accordingly, troughs can be used not only to reduce stress, but also to modify the stiffness of the membrane. By planning the orientation, depth, and location of the troughs, both stress characteristics and stiffness characteristics of a MEMS device can be optimized for a particular application.

FIG. 4 depicts a MEMS device 140 that includes troughs 142 and a released membrane 144. The troughs 142 are significantly wider than the troughs in the embodiments of FIGS. 1-3. The troughs 142, however, are located only at the corners of the membrane 144. Thus, while the stiffness of the membrane 144 is not significantly reduced, stress patterns will be focused by the troughs 142. Stress focusing is shown, for a different embodiment, in the stress simulation results depicted in FIG. 5.

FIG. 5 depicts a stress simulation performed on a porous silicon diaphragm 150. The diaphragm 150 is 12 μm thick and includes two 6 μm troughs 152 and 154. For the depicted simulation, a 100 kPa force was applied at location 156, which is the center of the porous silicon diaphragm 150.

The resulting stress pattern included a region of high stress (0.884E+08 kPa) in the area 158 immediately around the applied force. Stress was focused as a result of the support of the porous silicon diaphragm 150 at the edges 160, 162, and 164 even without any troughs. The stress at the edges 160, 162, and 164 reached 0.118E+09 kPa.

Stress was also focused at the remaining edge 166. The stress pattern at the edge 166 is modified, however, by the troughs 152 and 154. The stress is concentrated over a smaller area, resulting in a string of stress areas 168 that reach 0.147E+09 kPa. Thus, the troughs 152 and 154 provide stress/strain focusing at predetermined sites. By positioning a piezoresistor at the predetermined site, larger variations in piezoresistor output may be obtained for a given applied pressure. Of course, stress modification may be used in a variety of sensor types in addition to those incorporating piezoresistors including, for example, capacitive sensors.

Figure 6:
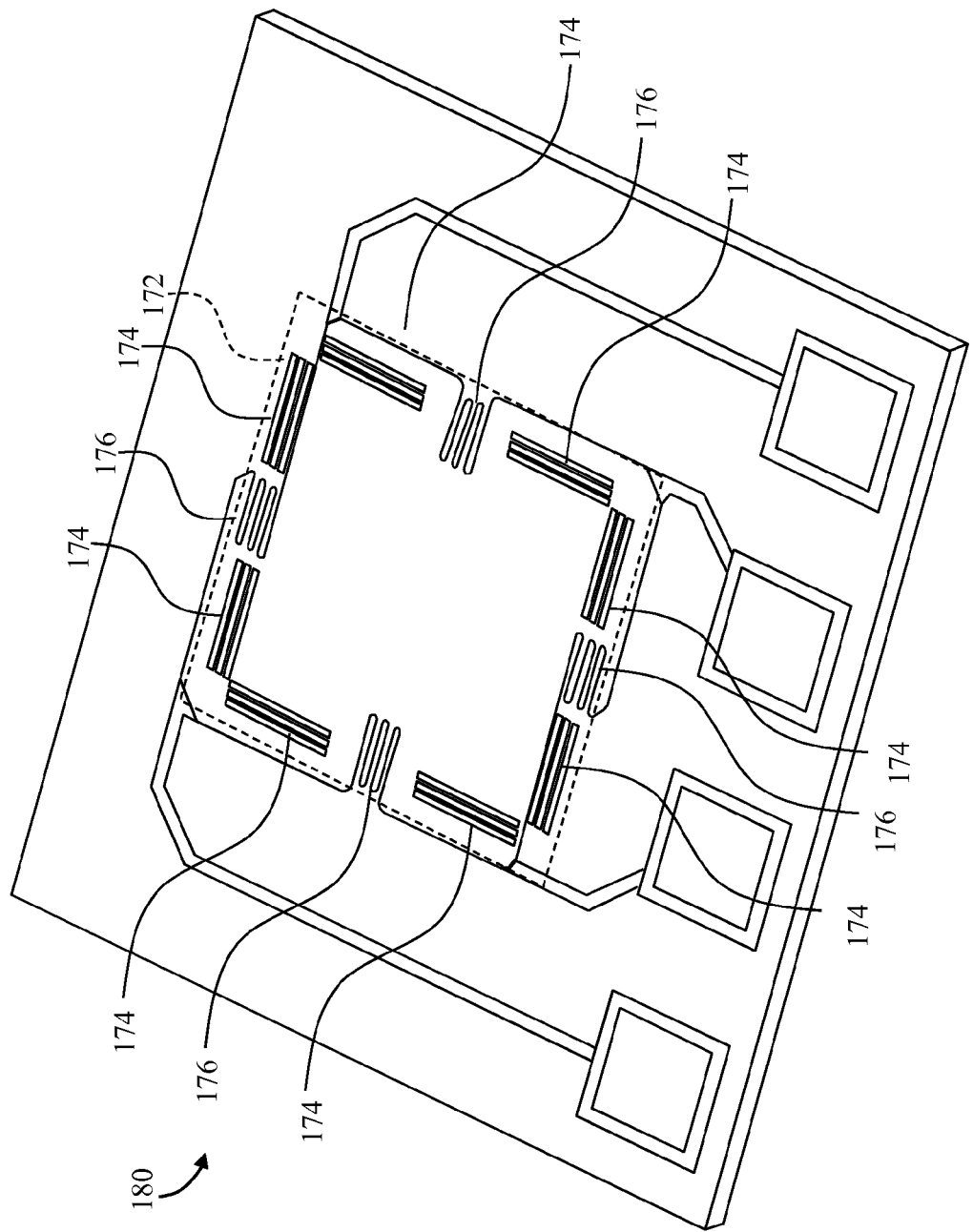
FIG. 6 depicts a perspective view of a MEMS device with a released membrane incorporating spaced apart troughs along each edge of the membrane resulting in a focusing of stress in the areas between the spaced apart troughs which are occupied by a respective piezoresistor.

The stress modification pattern affected by the troughs 152 and 154 thus show that precise geometry of corrugations (width, depth, shape, etc.) can be used to fine-tune the effect of the troughs. The embodiment of FIG. 6 utilizes the basic arrangement of the troughs 152 and 154 of FIG. 5 in order to maximize sensitivity of a device to a deflection of a membrane. In FIG. 6, a MEMS device 170 includes a released membrane 172. Each edge of the released membrane 172 includes spaced apart trough groups 174. A piezoresistor 176 is positioned in the area between the spaced apart trough groups 174.

As is evident from FIG. 5, spaced apart troughs 152 and 154 focus stress in the area between the spaced apart troughs 152/154. Likewise, the spaced apart trough groups 174 focus stress in the area occupied by the piezoresistors 178. Thus, any stress in the membrane 172, whether as a result of applied force or differential pressure across the membrane 172, is focused by the spaced apart troughs 152 and 154 into the areas occupied by the piezoresistors 178. If desired, more or fewer groupings of spaced apart troughs may be provided.

In the foregoing embodiments, the partial troughs are depicted as extending downwardly from an upper surface of the devices. If desired, troughs may also be formed which extend upwardly from a lower surface of a membrane layer. For example, FIG. 6 depicts a MEMS device 180 which includes a substrate layer 182 and a membrane layer 184 which is spaced apart from the substrate layer 182 by a spacer layer 186. The membrane layer 184 has a released membrane portion 188.

Stress within the membrane portion 108 is modified by troughs 190 and 192. The troughs 190 are positioned within the released membrane 188. Thus, the troughs 190 also modify the stiffness of the released membrane 188. The troughs 190 and 192 may be formed in a number of different approaches. For example, the troughs 190 and 192 may be etched into the membrane layer 184, and the membrane layer 184 may then be bonded to the spacer layer 186.

Figure 7:
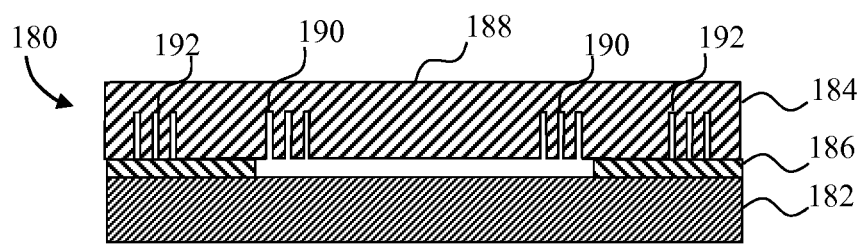
FIG. 7 depicts a side cross sectional view of a device with a released membrane including troughs which extend upwardly into the membrane layer both in the released membrane portion and the unreleased portion of the membrane layer so as to modify both the stiffness of the released membrane as well as the stress characteristics of the membrane layer.
Figure 8:
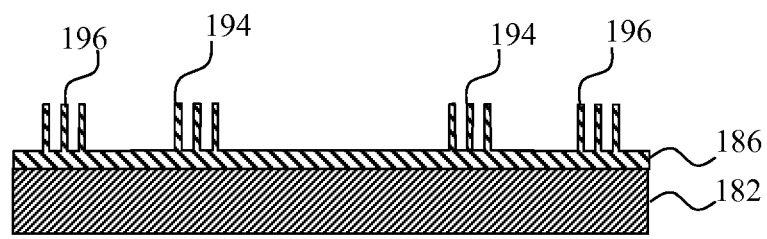
FIG. 8 depicts a side cross sectional view of the substrate of FIG. 8 with sacrificial ridges provided on the spacer layer prior to deposition of the membrane layer onto the spacer layer.

Alternatively, sacrificial ridges 194 and 196 may be formed on the spacer layer 106 prior to formation of the membrane layer 184 as depicted in FIG. 7. After deposition of the membrane layer 184 (see FIG. 8), the sacrificial ridges 194 and 196 may then be etched. The sacrificial ridges 194 may be etched concurrent with the release of the membrane 188. The sacrificial ridges 196 may be etched separately or at the same time as the membrane release using an etch stop positioned between the sacrificial ridges 196 and the spacer layer 186.

Figure 9:
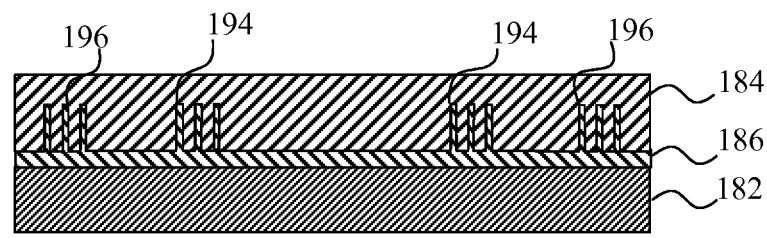
FIG. 9 depicts a side cross sectional view of the substrate of FIG. 8 with sacrificial ridges provided on the spacer layer after deposition of the membrane layer onto the spacer layer.

Devices incorporating bond rings may also be provided with stress modification troughs. One approach to manufacturing such a device is discussed below with reference to FIGS. 9-12. In FIG. 9, a device 200 includes a substrate layer 202, a spacer layer 204, and a device layer 206. The device layer 206 includes a released membrane 208. A bond ring 210 is located on the lower surface of the substrate layer 202. The bond ring 10 may be formed by soldering, eutectic, or any other approach useful in bonding one substrate to another substrate.

Figure 10:
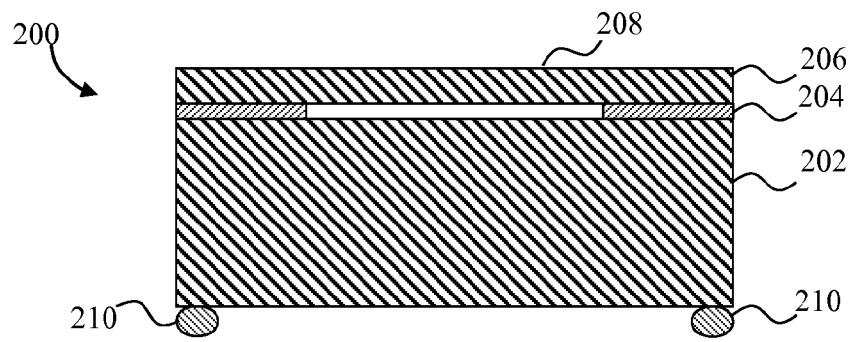
FIGS. 10-13 depict various stages in the manufacture of a device incorporating upwardly extending troughs within a bond ring.
Figure 11:
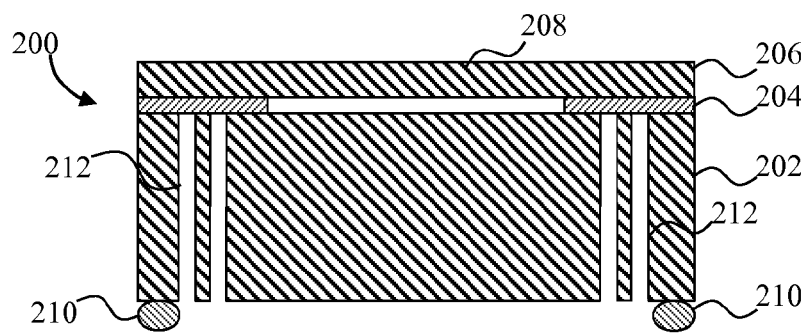
Figure 12:
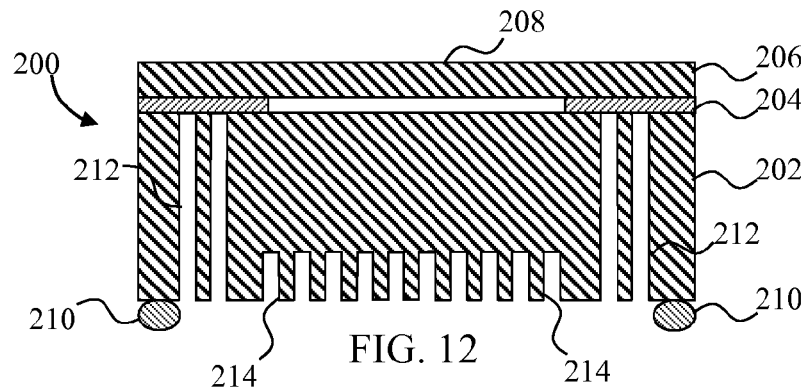
Figure 13:
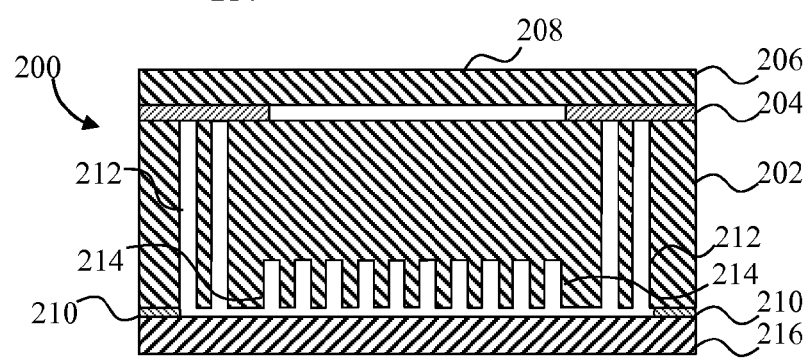

In this embodiment, two different depths are desired for stress modification troughs. Accordingly, in a first etching process, stress modification troughs 212 are etched at locations within the bond ring as depicted in FIG. 10. During an ensuing etching step, additional troughs 214 are etched (FIG. 11). During the second etching step, additional material is etched out of the troughs 212. If desired, troughs of different widths may be provided. The incorporation of troughs having different depths allows for increased substrate strength beneath the released membrane 208 while still providing stress modification.

When the desired troughs have been formed, the bond ring 210 is used to bond the substrate layer 202 to a base substrate layer 216. If desired, the base substrate layer 216 may be, for example, a cap layer of another MEMS device.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of modifying stress characteristics of a membrane comprising:
    providing a membrane layer;
    determining a desired stress modification of a portion of the membrane layer; and
    forming at least one trough in the membrane layer based upon the determined desired stress modification, wherein forming at least one trough comprises:
    determining a trough pattern based upon the determined desired stress modification;
    forming a first trough in the membrane layer through an upper surface of the membrane layer based upon the determined trough pattern; and
    forming a second trough in the membrane layer through a lower surface of the membrane layer based upon the determined trough pattern.

2. The method of claim 1, further comprising:
    releasing a membrane portion of the membrane layer from an underlying handle layer.

3. The method of claim 1, wherein determining a trough pattern comprises:
    determining a width, a depth, and a shape of the at least one trough based upon the determined desired stress modification.

4. The method of claim 1, wherein:
    determining a desired stress modification comprises determining a stress focusing area of the membrane; and
    forming at least one trough comprises
        determining the trough pattern based on the determined stress focusing.

5. The method of claim 1, wherein:
    determining a desired stress modification comprises determining a stress isolating area of the membrane; and
    forming at least one trough comprises
        determining a trough pattern based on the determined stress isolating area.

6. The method of claim 1, wherein forming at least one trough comprises forming at least one trough in the membrane layer at a location adjacent to a membrane portion of the membrane layer.

7. The method of claim 1, wherein forming at least one trough comprises forming at least one trough in the membrane layer at a location within a membrane portion of the membrane layer.

8. The method of claim 1, wherein forming at least one trough comprises forming at least one trough in the membrane layer parallel to an edge of a membrane portion of the membrane layer.

9. The method of claim 1, wherein forming at least one trough comprises:
    forming the first trough in the membrane layer with a first trough depth; and
    forming the second trough in the membrane layer with a second trough depth, wherein the first trough depth is deeper than the second trough depth.

10. The method of claim 1, wherein forming at least one trough comprises:
    forming at least a portion of the first trough in the membrane layer parallel to an edge of a membrane portion of the membrane layer; and
    forming at least a portion of the second trough in the membrane layer parallel to the edge of the membrane portion of the membrane layer.

11. The method of claim 10, wherein the at least a portion of the first trough in the membrane layer is parallel to the at least a portion of the second trough in the membrane layer.

12. The method of claim 11, wherein the first trough in the membrane layer only partially overlaps the second trough in the membrane layer.

13. The method of claim 1, wherein forming at least one trough comprises forming at least one curved trough in the membrane layer.

14. The method of claim 1, wherein:
    providing a membrane layer comprises forming a membrane layer on an upper surface of a substrate layer; and
    forming at least one trough in the membrane layer comprises forming the first trough in the membrane layer, the first trough extending from an upper surface of the membrane layer and terminating within the membrane layer, the first trough positioned such that when a membrane portion of the membrane layer is released from the substrate layer, the first trough is directly above a portion of the substrate layer.

15. The method of claim 14, wherein:
    forming at least one trough in the membrane layer comprises forming the second trough through the membrane layer, the second trough extending from the lower surface of the membrane layer to an upper surface of the membrane layer, the second trough positioned such that when the membrane portion of the membrane layer is released from the substrate layer, the second trough is directly above a portion of the substrate layer.

16. A method of modifying stress characteristics of a membrane comprising:
    forming a membrane layer on an upper surface of a substrate layer;
    determining a desired stress modification of a portion of the membrane layer; and
    forming a first trough in the membrane layer based upon the desired stress modification, the first trough extending from an upper surface of the membrane layer and terminating within the membrane layer, the first trough positioned such that when a membrane portion of the membrane layer is released from the substrate layer, the first trough is directly above a portion of the substrate layer;
    forming a second trough through the membrane layer based upon the desired stress modification, the second trough extending from the upper surface of the membrane layer to a lower surface of the membrane layer, the second trough positioned such that when the membrane portion of the membrane layer is released from the substrate layer, the second trough is directly above a portion of the substrate layer.

17. The method of claim 16, further comprising:
    determining a trough geometry for the second trough based upon the determined desired stress modification.

18. The method of claim 17, wherein determining a trough geometry comprises:
    determining a width, a depth, and a shape of the second trough based upon the determined desired stress modification.

19. The method of claim 16, wherein:
    determining a desired stress modification comprises determining a stress focusing area of the membrane; and forming the first trough comprises forming the first trough based on the determined stress focusing area.

20. The method of claim 16, wherein:
determining a desired stress modification comprises determining a stress isolating area of the membrane; and
forming the first trough comprises forming the first trough based on the determined stress isolating area.

* * * * *